United States Patent
Li et al.

(10) Patent No.: US 9,825,106 B2
(45) Date of Patent: *Nov. 21, 2017

(54) OLED DISPLAY SUBSTRATE AND METHOD FOR MANUFACTURING THE SAME, AND DISPLAY APPARATUS

(71) Applicant: BOE TECHNOLOGY GROUP CO., LTD., Beijing (CN)

(72) Inventors: Yansong Li, Beijing (CN); Xiaowei Xu, Beijing (CN); Liangjian Li, Beijing (CN)

(73) Assignee: BOE TECHNOLOGY GROUP CO., LTD. (CN)

( * ) Notice: Subject to any disclaimer, the term of this patent is extended or adjusted under 35 U.S.C. 154(b) by 0 days.

This patent is subject to a terminal disclaimer.

(21) Appl. No.: 15/244,930

(22) Filed: Aug. 23, 2016

(65) Prior Publication Data

US 2017/0271418 A1    Sep. 21, 2017

(30) Foreign Application Priority Data

Mar. 16, 2016  (CN) .......................... 2016 1 0149846

(51) Int. Cl.
   *H01L 51/56*  (2006.01)
   *H01L 27/32*  (2006.01)
   *H01L 51/52*  (2006.01)

(52) U.S. Cl.
   CPC ...... *H01L 27/3246* (2013.01); *H01L 51/5271* (2013.01); *H01L 51/56* (2013.01)

(58) Field of Classification Search
   CPC .......................... H01L 27/326; H01L 27/3246
   USPC ................................................. 313/504, 506
   See application file for complete search history.

(56) References Cited

U.S. PATENT DOCUMENTS

| | | | |
|---|---|---|---|
| 5,834,893 A | 11/1998 | Bulovic et al. | |
| 9,728,693 B2* | 8/2017 | Hatano | .................. H01L 33/62 |
| 2004/0183436 A1 | 9/2004 | Ito et al. | |
| 2005/0046342 A1* | 3/2005 | Park | ..................... H01L 27/3246 313/504 |
| 2007/0103062 A1* | 5/2007 | Jung | ................... H01L 51/5271 313/504 |
| 2009/0066237 A1* | 3/2009 | Kambe | ............... H01L 51/5218 313/504 |
| 2009/0174320 A1* | 7/2009 | Kim | .................... H01L 27/3246 313/504 |

(Continued)

FOREIGN PATENT DOCUMENTS

| | | |
|---|---|---|
| CN | 1545371 A | 11/2004 |
| CN | 1770933 A | 5/2006 |

(Continued)

OTHER PUBLICATIONS

Machine translation, Hata, Korean Reg. No. KR 10-1009528, translation date: Sep. 13, 2017, KIPO, all pages.*

(Continued)

*Primary Examiner* — Victoria K Hall
(74) *Attorney, Agent, or Firm* — Brooks Kushman P.C.

(57) ABSTRACT

The present disclosure discloses an OLED display substrate and a manufacturing method thereof, and a display apparatus. The OLED display substrate is a top emitting OLED display substrate, and comprises a reflective layer covering side surfaces of a pixel defining layer, thus the reflective layer and a first electrode of the OLED form a reflective cup which increases the reflection of light emitted from the OLED.

18 Claims, 3 Drawing Sheets

(56) References Cited

U.S. PATENT DOCUMENTS

| | | | | |
|---|---|---|---|---|
| 2009/0242883 A1* | 10/2009 | Lin | ................... | H01L 29/42384 |
| | | | | 257/59 |
| 2009/0256164 A1* | 10/2009 | Fang | .................... | H01L 27/124 |
| | | | | 257/88 |
| 2011/0156040 A1* | 6/2011 | Kwack | ................ | H01L 27/0207 |
| | | | | 257/59 |
| 2013/0087794 A1* | 4/2013 | Kwack | .................... | H01L 27/02 |
| | | | | 257/59 |
| 2013/0187163 A1* | 7/2013 | Kim | .................... | H01L 51/5271 |
| | | | | 257/59 |
| 2014/0159064 A1* | 6/2014 | Sakariya | ............. | H01L 25/0753 |
| | | | | 257/88 |
| 2016/0359142 A1* | 12/2016 | Huangfu | ................. | H01L 27/32 |
| 2017/0141167 A1* | 5/2017 | Naganuma | .......... | H01L 27/3246 |

FOREIGN PATENT DOCUMENTS

| | | | | |
|---|---|---|---|---|
| CN | 1964064 A | | 5/2007 | |
| CN | 103219354 A | | 7/2013 | |
| CN | 104037357 A | | 9/2014 | |
| CN | 104269427 A | | 1/2015 | |
| KR | 10-1009528 | * | 1/2011 | ............. H01L 33/48 |

OTHER PUBLICATIONS

Chinese First Office Action for Chinese Application No. 201610149846.0, dated Jan. 4, 2017, 7 Pages.
Chinese Second Office Action for Chinese Application No. 201610149846.0, dated Jul. 12, 2017, 7 Pages.

\* cited by examiner

# OLED DISPLAY SUBSTRATE AND METHOD FOR MANUFACTURING THE SAME, AND DISPLAY APPARATUS

CROSS-REFERENCE TO RELATED APPLICATIONS

This application claims priority to Chinese Patent Application No. 201610149846.0, filed Mar. 16, 2016, which is hereby incorporated by reference in its entirety.

TECHNICAL FIELD

This disclosure relates to the field of display technology, in particular to an OLED display substrate and a manufacturing method thereof and a display apparatus.

BACKGROUND

An organic light-emitting diode ("OLED" for short) display has advantages of active light emission, good temperature characteristics, low power consumption, fast response, bendability, ultralight weight, ultrasmall thickness and low cost, etc., and has been widely used in display devices.

OLED displays can be divided into three types depending on the light-emitting direction: bottom emitting OLEDs in which light is emitted in a direction from a backplate, top emitting OLEDs in which light is emitted in a direction from the top of the device, and double-sided emitting OLEDs in which light is emitted in a direction simultaneously from both the substrate and the top of the device. The top emitting OLED is independent of whether the substrate can transmit light or not, and can effectively improve the aperture ratio of the display panel, facilitates the integration with a transistor backplate, and can also narrow the spectrum and improve color purity. Therefore, the top emitting OLED is widely applied to flat panel displays.

However, many studies have shown that output efficiency of light of the top emitting OLED is low, i.e., external quantum efficiency is low, and usually only 20% at the highest level. Factors that affect the output of light may be roughly divided into four types: waveguide effect, substrate effect, surface plasma effect and absorption effect.

SUMMARY

In view of the above, the present disclosure provides an OLED display substrate and a manufacturing method thereof, and a display apparatus which can solve the problem that the external quantum efficiency of the OLED display apparatus is low.

In order to solve the problem of low external quantum efficiency, the present disclosure provides technical solutions as follows.

According to one aspect of the present disclosure, it provides an OLED display substrate comprising a pixel defining layer arranged on a base and configured to define pixel regions, and each of the pixel regions being provided with an OLED comprising a first electrode, an organic light-emitting layer and a second electrode arranged on the base in sequence, wherein side surfaces of the pixel defining layer, adjacent to an upper surface thereof which is away from the base, are covered with a reflective layer, and the first electrode is made of a reflective material.

According to another aspect of the present disclosure, it provides a display apparatuses comprising the OLED display substrate as described above.

According to a further aspect of the present disclosure, it provides a method of manufacturing the OLED display substrate as described above, comprising steps of: providing a base; forming a pixel defining layer on the base to define pixel regions; and forming an OLED in each of the pixel regions, which comprises forming a first electrode, an organic light-emitting layer and a second electrode on the base, wherein the manufacturing method further comprises forming a reflective layer on side surfaces of the pixel defining layer adjacent to an upper surface thereof which is away from the base; and forming the first electrode by a patterning process for a conductive film comprising a reflective material.

The following advantageous effects are produced by the above technical solutions.

In the above technical solutions, the top emitting OLED display substrate comprises the reflective layer covering side surfaces of the pixel defining layer, thus the reflective layer and the first electrode of the OLED form a reflective cup. The reflective cup increases the reflection of light emitted from the OLED, reduces the waveguide effect, and thus improves the external quantum efficiency of the display device.

DESCRIPTION OF THE DRAWINGS

In order to explain the present disclosure or those in prior art more clearly, accompanying drawings required for describing embodiments or the prior are briefly introduced below. Obviously, the drawings described below merely represent some embodiments of the present disclosure. A person skilled in the art may obtain other drawings based on these drawings without exercising any inventive skill.

DETAILED DESCRIPTION

As required, detailed embodiments are disclosed herein. However, it is to be understood that the disclosed embodiments are merely exemplary and that various and alternative forms may be employed. The figures are not necessarily to scale. Some features may be exaggerated or minimized to show details of particular components. Therefore, specific structural and functional details disclosed herein are not to be interpreted as limiting, but merely as a representative basis for teaching one skilled in the art.

Below, the present disclosure is further described in detail in conjunction with the drawings and embodiments. The following embodiments are merely for illustrating the present disclosure, but not intended to limit the scope of the present disclosure.

Figure 1:
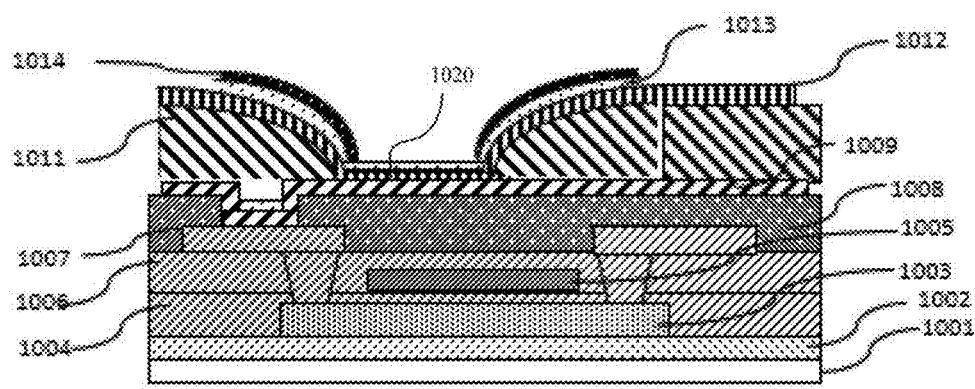
FIG. 1 shows a structural schematic diagram of an OLED display substrate according to an embodiment of the present disclosure.

As shown in FIG. 1, an embodiment of the present disclosure provides a top emitting OLED display substrate comprising a pixel defining layer 1011 arranged on a base 1001 and configured to define pixel regions. The base 1001 may be a transparent base such as a quartz base, a glass base, or an organic resin base. Each of the pixel regions comprises an OLED comprising a first electrode 1020, an organic light-emitting layer 1013 and a second electrode 1014. The first electrode 1020 is made of a reflective material such as Ag, and may be an anode of the OLED. The second electrode is a cathode of the OLED and made of a transparent conductive material such as ZnO, IGO, IZO, ITO or IGZO, or a thin layer of a metal composite such as MgAg. The second electrode may be a plate electrode covering the whole base 1001. OLEDs in all the pixel regions share one cathode.

It shall be indicated that, it is also applicable that the first electrode 1020 is the cathode of the OLED while the second electrode is the anode of the OLED. In this embodiment, the technical solution of the present disclosure will be explained by using the first electrode 1020 as the anode of the OLED.

For the convenience of description, an upper surface of the pixel defining layer 1011 is a surface away from the base 1001. Side surfaces of the pixel defining layer 1011 away from the upper surface are covered with a reflective layer 1012. The reflective layer 1012 and the anode 1020 form a reflective cup, thus increasing the reflection of light emitted from the OLED, reducing the waveguide effect and improving the external quantum efficiency of the device.

Figure 2:
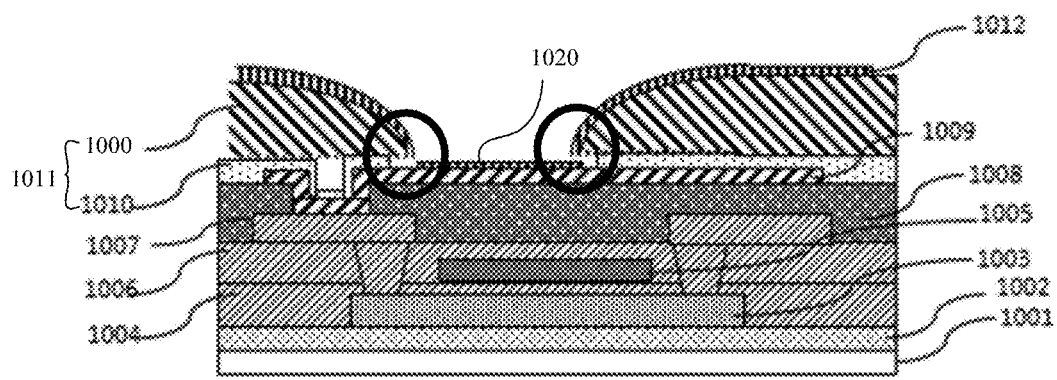
FIG. 2 shows a structural schematic diagram according to another embodiment of the present disclosure.

The reflective layer 1012 may be made of an insulating material or a conductive material. As shown in FIG. 2 (the organic light-emitting layer 1013 and the second electrode 1014 are not shown in this figure), when the reflective layer 1012 is made of a conductive material, the anode 1020 and the reflective layer 1012 are disconnected from each other so as to realize insulation. Therefore, side surfaces of the organic light-emitting layer of the OLED corresponding to the reflective layer 1012 do not reflect light, which ensures that the reflective layer 1012 merely functions to reflect light, thereby improving the reflection effect. Further, the reflective layer 1012 may be arranged to cover both the upper surface of the pixel defining layer 1011 and side surfaces thereof adjacent to the upper surface.

In order to simplify the manufacturing process, when the reflective layer 1012 is made of a conductive material, the reflective layer 1012 and the anode 1020 are arranged in the same layer, but disconnected from each other. Therefore, this manufacturing process does not require addition of the material and process to fabricate the reflective layer 1012 separately, which leads to a reduced production cost. Specifically, the reflective layer 1012 and the anode 1020 may be disconnected by over-etching the base, and the reflective layer 1012 may be arranged to cover both the upper surface of the pixel defining layer and the side surfaces thereof adjacent to the upper surface. The detailed process will be given below.

In this embodiment, the side surfaces of the pixel defining layer 1011 are covered with the reflective layer 1012. In order to ensure that the side surfaces of the pixel defining layer 1011 have an area large enough to support the reflective layer 1012, it is required to set at least a portion of the pixel defining layer 1011 to have a trapezoidal longitudinal section with an upper parallel side smaller than a lower parallel side, and a large thickness. The longitudinal section is a section of the pixel defining layer 1011 perpendicular to the base 1001.

When the reflective layer 1012 and the anode 1020 are arranged in the same layer and formed from the same conductive reflective layer, the pixel defining layer 1011 may be arranged to comprise a first insulating layer 1010 and a second insulating layer 1000 arranged on the base 1001 in sequence, a first orthographic projection of the first insulating layer 1010 on the base 1001 is located within a second orthographic projection of the second insulating layer 1000 on the base, and there is a distance between edges of the first orthographic projection and the second orthographic projection. Therefore, when a conductive reflective layer is formed on the pixel defining layer 1011, it will be disconnected at the edge of the pixel defining layer 1011 (as indicated in the bold line circle shown in FIG. 2), thereby forming the anode 1020 located in the pixel region and the reflective layer 1012 covering the upper surface of the pixel defining layer 1011 and side surfaces thereof adjacent to the upper surface. Further, the second insulating layer 1000 is arranged to have a large thickness and a trapezoidal longitudinal section with an upper parallel side smaller than a lower parallel side to provide support for the reflective layer 1012. The second insulating layer 1000 may be made of Acrylic material, while the first insulating layer 1010 may have a small thickness and is made of an inorganic insulating material such as silicon nitride and silicon oxide.

Depending on the driving mode, OLED display devices are divided into active matrix OLED display devices and passive matrix OLED display devices. The active matrix OLED display devices have advantages of low production cost, fast response, low power consumption, use as a DC drive of a portable device, and adaptability to a wide range of operation temperatures, and thus are more and more widely used.

The most commonly-used driving element for an active matrix OLED display device is a thin film transistor. Its display substrate also comprises thin film transistors located in respective pixel regions. The anode 1020 of the OLED is electrically connected with a drain electrode 1007 of the thin film transistor. The thin film transistors in each row are turned on by a gate scanning signal, a pixel voltage is transmitted to the anode 1020 through the thin film transistor and collaborates with the cathode to form a voltage difference for driving an organic light-emitting material to emit light, so as to realize self-luminescence.

When the reflective layer 1012 and the anode 1020 of the OLED are arranged in the same layer and disconnected from each other, the anode 1020 is merely located in the pixel region, and does not electrically connect with the drain electrode 1007. In order to overcome this problem, in this embodiment, a connection electrode 1009 is arranged, which comprises a first portion corresponding to and electrically connected with the drain electrode 1007 and a second portion corresponding to the anode 1020. The anode 1020 is arranged on the second portion of the connection electrode 1009 and in electrical contact with the connection electrode 1009, thus realizing the electrical connection between the anode 1020 and the drain electrode 1007 through the connection electrode 1009.

In this embodiment, the specific structure of the OLED display substrate will be explained using an active matrix OLED display substrate as an example. The OLED display substrate comprises:

a base 1001 comprising a plurality of pixel regions;

a buffer layer 1002 arranged on the base 1001 to improve the adhesion of the base 1001;

thin film transistors arranged on the buffer layer 1002 and located in the respective pixel regions, wherein the thin film transistor comprises:

an active layer 1003 arranged on the buffer layer 1002, which may be a silicon semiconductor (such as amorphous silicon or polycrystalline silicon) or a metal oxide semiconductor (such as ZnO, IGO, IZO, ITO or IGZO);

a gate insulating layer 1004 covering the active layer 1003, which may be a silicon nitride layer, a silicon oxide layer or a composite layer thereof;

a gate electrode 1005 arranged on the gate insulating layer 1004, which may be made of Cu, Al, Ag, Mo, Cr, Nd, Ni, Mn, Ti, Ta, W or an alloy thereof and which may be a single-layered structure, or a multi-layered structure that may be, for example, Cu\Mo, Ti\Cu\Ti, Mo\Al\Mo, etc.;

an interlayer insulating layer 1006 covering the gate electrode 1005, which may be a silicon nitride layer, a silicon oxide layer or a composite layer thereof;

a source electrode and a drain electrode 1007 arranged on the interlayer insulating layer 1006 and in electrical contact with the active layer 1003 through a via-hole penetrating the interlayer insulating layer 1006 and the gate insulating layer 1004, wherein the source electrode and the drain electrode 1007 may be made of Cu, Al, Ag, Mo, Cr, Nd, Ni, Mn, Ti, Ta, W or an alloy thereof and may be a single-layered structure, or a multi-layered structure that may be, for example, Cu\Mo, Ti\Cu\Ti, Mo\Al\Mo, etc.;

a planarization layer 1008 covering the thin film transistors, which may be made of Acrylic material or an organic resin material;

a connection electrode 1009 arranged on the planarization layer 1008 and in electrical contact with the drain electrode 1007 of the thin film transistor through a via-hole penetrating the planarization layer 1008;

a pixel defining layer 1011 arranged on the connection electrode 1009 to define a plurality of pixel regions, wherein the pixel defining layer 1011 comprises a first insulating layer 1010 and a second insulating layer 1000 arranged on the base 1001 in sequence, a first orthographic projection of the first insulating layer 1010 on the base 1001 is located within a second orthographic projection of the second insulating layer 1000 on the base, and there is a distance between edges of the first orthographic projection and the second orthographic projection;

a reflective layer 1012 covering an upper surface and side surfaces of the pixel defining layer 1011, which may be made of Ag;

an OLED arranged on the connection electrode 1009 and located in each of the pixel regions, the OLED comprising:

an anode 1020 arranged on and in contact with the connection electrode 1009, wherein the anode 1020 and the reflective layer 1012 are arranged in the same layer and are disconnected from each other at the edge of the pixel defining layer 1011;

an organic light-emitting layer arranged on the anode 1020;

a cathode arranged on the organic light-emitting layer and covering the whole base 1001; and a packaging layer covering the OLED and comprising an inorganic insulating layer, for example, a silicon nitride layer, a silicon oxide layer or a composite layer thereof, to block water and oxygen in the environment and thus prevent them from affecting the performance of the OLED.

It shall be indicated that, the technical solution of the present disclosure is applicable to not only an active matrix OLED substrate in which a coplanar thin film transistor is used as the driving element but also an active matrix OLED substrate in which a thin film transistor of other type is used as the driving element, such as an active matrix OLED substrate in which a top gate thin film transistor or a bottom gate thin film transistor is used as the driving element.

In the above technical solution, the first electrode 1020 is the anode of the OLED and arranged in the same layer as the reflective layer 1012, and they are made from the same reflective film. The technical solution of the present disclosure is also applicable to a case where the first electrode 1020 is a cathode of the OLED. In this case, the cathode of the OLED and the reflective layer 1012 are arranged in the same layer and made from the same transflective film. Further, the connection electrode 1009 may be arranged to be the anode of the OLED and made from a reflective material such as Ag, and an organic light-emitting layer is provided between the connection electrode 1009 and the cathode, which also can produce the technical effect of the present disclosure. The transflective film may be a structure consisting of a portion which is a transparent conductive layer that may be made of ZnO, IGO, IZO, ITO, IGZO or the like, and the other portion which is a conductive reflective layer.

According to another embodiment of the present disclosure, it further provides a display apparatus comprising the OLED display substrate as described above, to improve the brightness of the display apparatus and reduce the power consumption.

According to another embodiment of the present disclosure, it provides a method of manufacturing a top emitting OLED display substrate, comprising steps of:

providing a base 1001;

forming a pixel defining layer 1011 on the base 1001 to define pixel regions; and forming an OLED in each of the pixel regions, which comprises a step of forming a first electrode 1020, an organic light-emitting layer and a second electrode on the base 1001.

The method further comprises forming a reflective layer 1012 on side surfaces of the pixel defining layer 1011 adjacent to its upper surface which is away from the base 1001; and forming a first electrode 1020 of the OLED by a process for patterning a conductive film comprising a reflective material.

The first electrode 1020 may be the anode of the OLED.

In the OLED display substrate formed through the above steps, the reflective layer 1012 covering the side surfaces of the pixel defining layer 1011 and the anode 1020 of the OLED form a reflective cup. The OLED display substrate comprising the reflective cup increases the reflection of light emitted from the OLED, reduces the waveguide effect and improves the external quantum efficiency.

Optionally, the reflective layer 1012 is made of a conductive material, and the anode 1020 and the reflective layer 1012 are disconnected from each other so as to realize insulation. Therefore, side surfaces of the organic light-emitting layer of the OLED corresponding to the reflective layer 1012 do not emit light, which ensures the reflective layer 1012 merely functions to reflect light, thereby improving the reflection effect. Further, the reflective layer 1012 may be arranged to cover both the upper surface of the pixel defining layer 1011 and side surfaces thereof adjacent to the upper surface.

Figure 5:
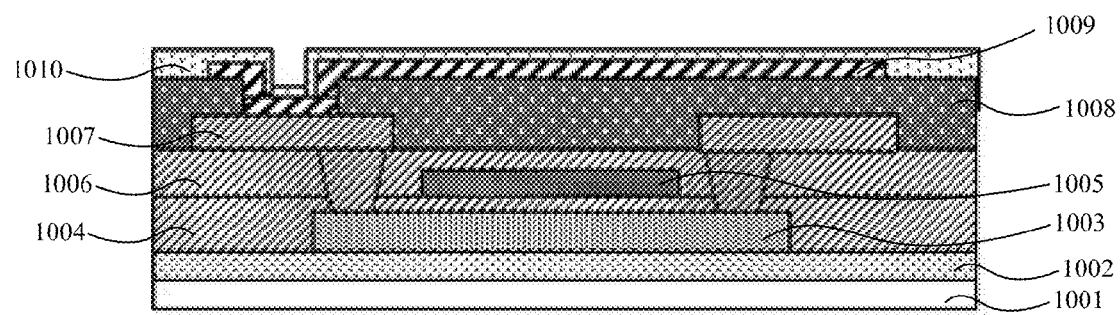
Figure 6:
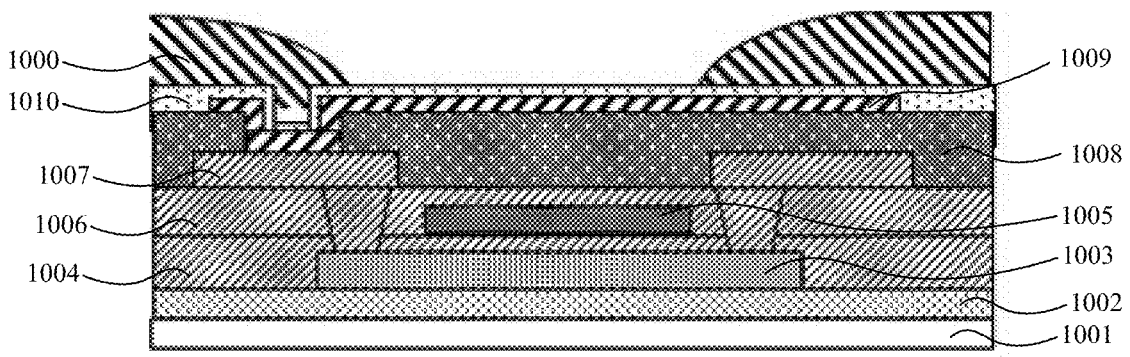
Figure 7:
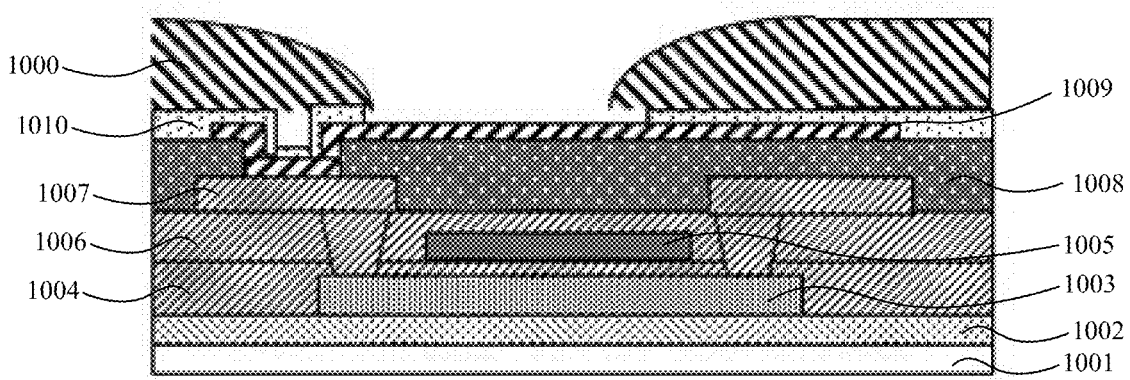

In another embodiment of the present disclosure, as shown in FIG. 2, the reflective layer 1012 and the anode 1020 of the OLED are formed by a process of patterning the same conductive reflective layer, but disconnected from each other. This process does not require addition of the material and process to fabricate the reflective layer 1012 separately, which leads to a reduced production cost. The anode 1020 and the reflective layer 1012 may be disconnected by over-etching the base. As shown in FIGS. 5 to 7, the step of forming the pixel defining layer 1011 may comprise:

forming the first insulating layer 1010 and the second insulating layer 1000 on the base in sequence;

coating a photoresist on the second insulating layer 1000, and subjecting it to exposure and development to form a photoresist-reserved region and a photoresist-unreserved region, wherein the photoresist-unreserved region is located at a position corresponding to the pixel regions, and the photoresist-reserved region is located at a position corresponding to other regions;

removing the second insulating layer 1000 in the photoresist-unreserved region using a first wet etching process, as shown in FIG. 6;

removing the first insulating layer 1010 in the photoresist-unreserved region using a second wet etching process as shown in FIG. 7, wherein the second wet etching process is carried out for a longer time than the first wet etching process; and removing the rest of the photoresist from the pixel defining layer 1011, as shown in FIG. 2.

The pixel defining layer 1011 formed through these steps comprises the first insulating layer 1010 and the second insulating layer 1000, a first orthographic projection of the first insulating layer 1010 on the base 1001 is located within a second orthographic projection of the second insulating layer 1000 on the base, and there is a distance between edges of the first orthographic projection and the second orthographic projection. Therefore, when a conductive reflective layer is formed on the pixel defining layer 1011, the conductive reflective layer will be disconnected at the edge of the pixel defining region 1011 to form the anode 1020 in the pixel region and the reflective layer 1012 covering the upper surface of the pixel defining layer 1011 and side surfaces thereof adjacent to the upper surface. In order to realize the over-etching of the bottom layer, it is necessary to control an amount of an etching solution. During etching the first insulating layer 1010, the first insulating layer 1010 in the photoresist-unreserved region should be completely removed by etching with the etching solution while a part of the second insulating layer 1000 in the photoresist-unreserved region is removed by etching with the etching solution.

The first wet etching process and the second wet etching process may be carried out using a concentrated acid etching solution or a hydrofluoric acid etching solution. In this embodiment, both the first and the second wet etching process are carried out using the hydrofluoric acid etching solution.

Further, the second insulating layer 1000 is arranged to have a large thickness and a trapezoidal longitudinal section with an upper parallel side smaller than a lower parallel side to provide support for the reflective layer 1012. The second insulating layer may be made of Acrylic material, while the first insulating layer 1010 may have a small thickness and is made of an inorganic insulating material such as silicon nitride, silicon oxide.

For an active matrix OLED display substrate in which a thin film transistor is used as the driving element, the anode 1020 of the OLED is connected with the drain electrode 1007 of the thin film transistor. However, when the reflective layer 1012 and the anode 1020 of the OLED are formed from the same conductive reflective layer and are disconnected from each other, the anode 1020 is merely located in the pixel region, which restricts its connection with the drain electrode 1007. In order to overcome this problem, the manufacturing method in this example further comprises:

patterning the transparent conductive layer to form the connection electrode 1009 comprising a first portion corresponding to and electrically connected with the drain electrode 1007 and a second portion corresponding to the anode 1020. The anode 1020 of the OLED is arranged on the second portion of the connection electrode 1009 and in electrical contact with the connection electrode 1009, thus realizing the electrical connection between the anode 1020 and the drain electrode 1007 through the connection electrode 1009.

By combining FIGS. 2-7, the process of manufacturing the OLED display substrate will be explained using an active matrix OLED display substrate in which a thin film transistor is used as the driving element as an example.

Figure 3:
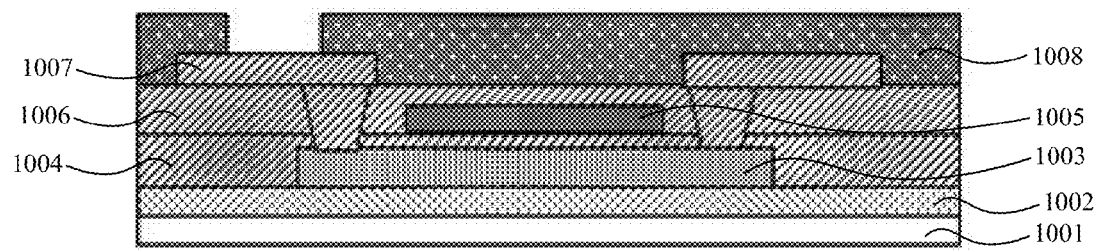
FIGS. 3-7 show schematic diagrams of a process of manufacturing the OLED display substrate shown in FIG. 2.
Figure 4:
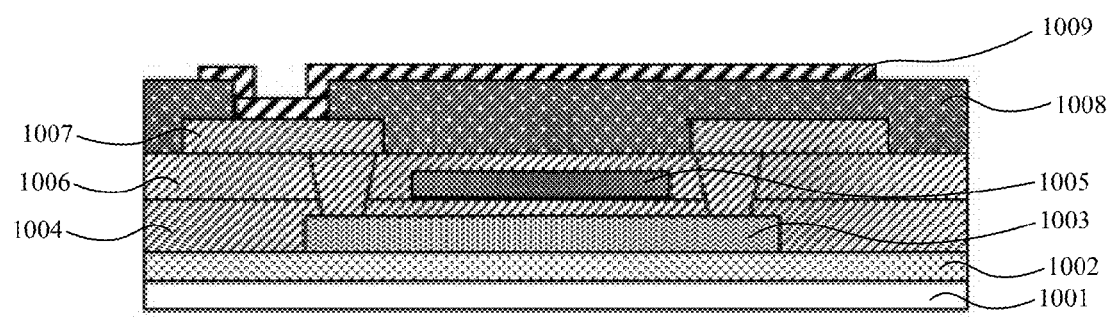

The method of manufacturing the OLED display substrate comprises steps of:

providing a base 1001 comprising a plurality of pixel regions as shown in FIG. 3;

forming a buffer layer 1002 on the base 1001 to improve the adhesion of the base 1001;

forming thin film transistors, on the buffer layer 1002, located in the respective pixel regions, as shown in FIG. 3, wherein the step of forming the thin film transistors comprises:

forming an active layer 1003 on the buffer layer 1002;

forming an gate insulating layer 1004 covering the active layer 1003;

forming a gate electrode 1005 on the gate insulating layer 1004;

forming an interlayer insulating layer 1006 covering the gate electrode 1005, and forming first via-holes penetrating the interlayer insulating layer 1006 and the gate insulating layer 1004;

forming a source electrode and a drain electrode 1007 on the interlayer insulating layer 1006 and in electrical contact with the active layer 1003 through the first via-holes;

forming a planarization layer 1008 covering the thin film transistors, and forming a second via-hole in the planarization layer 1008, as shown in FIG. 3;

forming a connection electrode 1009 on the planarization layer 1008 and in electrical contact with the drain electrode 1007 of the thin film transistor through the second via-hole, as shown in FIG. 4; and forming a pixel defining layer on the connection electrode 1009 to define the plurality of the pixel regions.

As shown in FIGS. 5 to 7, the step of forming the pixel defining layer comprises forming the first insulating layer 1010 and the second insulating layer 1000 on the base 1001 in sequence, a first orthographic projection of the first insulating layer 1010 on the base 1001 is located within a second orthographic projection of the second insulating layer 1000 on the base, and there is a distance between edges of the first orthographic projection and the second orthographic projection;

forming a conductive reflective layer covering the pixel defining layer 1011 and disconnected at the edge of the pixel defining layer 1011 to form the reflective layer 1012 covering an upper surface of the pixel defining layer 1011 and side surfaces thereof adjacent to the upper surface, and the anode 1020 of the OLED located in the pixel region, as shown in FIG. 2, wherein the anode 1020 is arranged on and in contact with the connection electrode 1009;

forming an organic light-emitting layer on the anode 1020;

forming a cathode on the organic light-emitting layer, the cathode covering the whole base 1001; and forming a packaging layer on the cathode to block water and oxygen.

Thus, the OLED display substrate is obtained.

The above are optional embodiments of the present disclosure. It shall be indicated that a person skilled having ordinary skills in the art may make several improvements and replacements without departing from the technical principle of the present disclosure, and these improvements and replacements shall be considered to be encompassed in the protection scope of the present disclosure.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. An organic light-emitting diode (OLED) display substrate, comprising a pixel defining layer arranged on a base and configured to define pixel regions, each of the pixel regions being provided with an OLED comprising a first electrode, an organic light-emitting layer and a second electrode arranged on the base in sequence;
wherein side surfaces of the pixel defining layer, adjacent to an upper surface of the pixel defining layer which is away from the base, are covered with a reflective layer, and the first electrode is made of a reflective material; and
wherein the pixel defining layer comprises a first insulating layer and a second insulating layer arranged on the base in sequence, a first orthographic projection of the first insulating layer on the base is located within a second orthographic projection of the second insulating layer on the base, and there is a distance between edges of the first orthographic projection and the second orthographic projection.

2. The OLED display substrate according to claim 1, wherein the reflective layer is made of a conductive material, and the first electrode and the reflective layer are disconnected from each other.

3. The OLED display substrate according to claim 1, wherein the reflective layer and the first electrode are arranged in a same layer.

4. The OLED display substrate according to claim 1, wherein the second insulating layer has a greater thickness than the first insulating layer.

5. The OLED display substrate according to claim 3, wherein the pixel region further comprises:
a thin film transistor;
a planarization layer covering the thin film transistor; and
a connection electrode arranged on the planarization layer and electrically connected with a drain electrode of the thin film transistor, and
wherein the first electrode is arranged on and in contact with the connection electrode.

6. The OLED display substrate according to claim 1, wherein the first electrode is an anode of the OLED.

7. The OLED display substrate according to claim 2, wherein the first electrode is an anode of the OLED.

8. A display apparatus comprising the display substrate according to claim 1.

9. The display apparatus according to claim 8, wherein the reflective layer is made of a conductive material, and the first electrode and the reflective layer are disconnected from each other.

10. The display apparatus according to claim 8, wherein the reflective layer and the first electrode are arranged in a same layer.

11. The display apparatus according to claim 8, wherein the second insulating layer has a greater thickness than the first insulating layer.

12. The display apparatus according to claim 10, wherein the pixel region further comprises:
a thin film transistor;
a planarization layer covering the thin film transistor; and
a connection electrode arranged on the planarization layer and electrically connected with a drain electrode of the thin film transistor, and
wherein the first electrode is arranged on and in contact with the connection electrode.

13. The display apparatus according to claim 8, wherein the first electrode is an anode of the OLED.

14. A method of manufacturing the OLED display substrate according to claim 1, comprising steps of:
providing the base;
forming the pixel defining layer on the base to define the pixel regions;
forming the OLED comprising the first electrode, the organic light-emitting layer and the second electrode in each of the pixel regions;
forming a reflective layer on side surfaces of the pixel defining layer adjacent to an upper surface of the pixel defining layer which is away from the base; and
forming the first electrode by a process for patterning a conductive layer comprising a reflective material.

15. The manufacturing method according to claim 14, wherein the reflective layer and the first electrode are formed by a process of patterning the same conductive reflective layer, and the first electrode and the reflective layer are disconnected from each other.

16. The manufacturing method according to claim 15, wherein the step of forming the pixel defining layer comprises:
forming a first insulating layer and a second insulating layer on the base in sequence;
coating a photoresist on the second insulating layer, and subjecting it to exposure and development to form a photoresist-reserved region and a photoresist-unreserved region, wherein the photoresist-unreserved region is located at position corresponding to the pixel regions, and the photoresist-reserved region is located at position corresponding to other region;
removing the second insulating layer in the photoresist-unreserved region using a first wet etching process;
removing the first insulating layer in the photoresist-unreserved region using a second wet etching process, wherein the second wet etching process is carried out for a longer time than the first wet etching process;
removing the photoresist to form the pixel defining layer comprising the first insulating layer and the second insulating layer.

17. The manufacturing method according to claim 16, wherein an etching solution used for both the first wet etching and the second wet etching is hydrofluoric acid.

18. The manufacturing method according to claim 16, wherein the second insulating layer is made of Acrylic material, and the first insulating layer is a silicon nitride layer or a silicon oxide layer.

* * * * *